US009987646B2

(12) United States Patent
Kimura

(10) Patent No.: US 9,987,646 B2
(45) Date of Patent: Jun. 5, 2018

(54) BONDING MATERIAL APPLYING APPARATUS AND BONDING MATERIAL APPLYING METHOD

(71) Applicant: MURATA MANUFACTURING CO., LTD., Kyoto-fu (JP)

(72) Inventor: Nobumichi Kimura, Kyoto-fu (JP)

(73) Assignee: Murata Manufacturing Co., Ltd., Kyoto-fu (JP)

(*) Notice: Subject to any disclaimer, the term of this patent is extended or adjusted under 35 U.S.C. 154(b) by 472 days.

(21) Appl. No.: 14/480,797

(22) Filed: Sep. 9, 2014

(65) Prior Publication Data
US 2015/0097006 A1 Apr. 9, 2015

(30) Foreign Application Priority Data
Oct. 7, 2013 (JP) ................... 2013-209920

(51) Int. Cl.
B65D 83/00 (2006.01)
B05B 11/02 (2006.01)
B05B 11/06 (2006.01)
H01L 23/00 (2006.01)

(52) U.S. Cl.
CPC ............ B05B 11/02 (2013.01); B05B 11/06 (2013.01); H01L 24/00 (2013.01); H01L 24/743 (2013.01)

(58) Field of Classification Search
CPC ......... B05B 11/02; B05B 11/06; B29C 45/20; B29C 45/1603; H01L 24/00; H01L 24/743

USPC ....... 222/394, 1, 52, 61, 638, 639, 320, 644; 156/64, 60, 366–368, 378, 291, 578
See application file for complete search history.

(56) References Cited

U.S. PATENT DOCUMENTS 5,867,390 A * 2/1999 Kinoh et al. ............... 700/123
6,173,864 B1 * 1/2001 Reighard et al. ............ 222/55
2010/0108256 A1 * 5/2010 Roajanasiri et al. ....... 156/291

FOREIGN PATENT DOCUMENTS

JP H01-307470 A 12/1989

* cited by examiner

Primary Examiner — Lien Ngo
(74) Attorney, Agent, or Firm — Studebaker & Brackett PC

(57) ABSTRACT

A bonding material applying apparatus includes a syringe in which a bonding material is filled. The syringe includes a discharge nozzle disposed at a tip thereof to discharge the bonding material filled in the syringe. A compressed air supply mechanism supplies compressed air to the syringe and discharges the bonding material from the discharge nozzle. When a discharge interval from the end of discharge to the start of discharge of the bonding material lasts for a certain time or longer, the compressed air supply mechanism supplies the compressed air for a time, which is shorter than a discharge time necessary to discharge the bonding material, to such an extent that the bonding material is substantially not discharged.

5 Claims, 4 Drawing Sheets

BONDING MATERIAL APPLYING APPARATUS AND BONDING MATERIAL APPLYING METHOD

CROSS REFERENCE TO RELATED APPLICATIONS

This application claims benefit of priority to Japanese Patent Application No. 2013-209920 filed Oct. 7, 2013, the entire content of which is incorporated herein by reference.

TECHNICAL FIELD

The present technical field relates to a bonding material applying apparatus and a bonding material applying method for pushing out a bonding material and applying it to an object. More particularly, the present disclosure relates to a bonding material applying apparatus and a bonding material applying method, which can reliably apply a predetermined amount of bonding material without wastefully discharging the bonding material.

BACKGROUND

In a manufacturing process for semiconductor devices, it has hitherto been required to apply a bonding material, which is a highly viscous fluid, onto a substrate, etc. in units of a predetermined amount. The bonding material is applied by, e.g., a bonding material applying apparatus (dispenser) in such a manner that the bonding material is pushed out to an applying head and is discharged in units of the predetermined amount.

For example, Japanese Unexamined Patent Application Publication No. 1-307470 discloses a viscous fluid applying apparatus in which a viscous fluid in a tank is discharged from a discharge nozzle in a predetermined amount by supplying compressed air, and is applied to a plate material, etc. In the viscous fluid applying apparatus disclosed in Japanese Unexamined Patent Application Publication No. 1-307470, the viscous fluid is wastefully discharged in a wastefully discharging station until the amount of the discharged viscous fluid is stabilized, and an actual application is started after the amount of the discharged viscous fluid has been stabilized.

As described above, in the viscous fluid applying apparatus disclosed in Japanese Unexamined Patent Application Publication No. 1-307470, it is required to wastefully discharge the viscous fluid until the discharge amount is stabilized. This raises the following problems. The viscous fluid (bonding material) is wasted. Furthermore, in the case of the wasteful discharging station being separately provided, when the viscous fluid is not applied for a certain time, the discharge nozzle is moved to the wasteful discharging station where the viscous fluid is wastefully discharged. Thereafter, the discharge nozzle is returned to a position where the viscous fluid is to be applied, and the viscous fluid is actually applied there. Thus, an applying operation is complicated.

SUMMARY

In view of the above-described situations, an object of the present disclosure is to provide a bonding material applying apparatus and a bonding material applying method, which can reliably apply a predetermined amount of bonding material by employing a compact apparatus without wastefully discharging the bonding material.

To achieve the above object, according to one preferred embodiment of the present disclosure, there is provided a bonding material applying apparatus includes a syringe in which a bonding material is filled, the syringe including a discharge nozzle disposed at a tip thereof to discharge the bonding material filled in the syringe, and a compressed air supply mechanism that supplies compressed air to the syringe and discharges the bonding material from the discharge nozzle, wherein when a discharge interval from end of discharge to start of discharge of the bonding material lasts for a certain time or longer, the compressed air supply mechanism supplies the compressed air for a time, which is shorter than a discharge time necessary to discharge the bonding material, to such an extent that the bonding material is substantially not discharged. With those features, even when air pressure in the syringe to which the compressed air is supplied from the compressed air supply mechanism has lowered due to lasting of the discharge interval for the certain time or longer, the air pressure can be raised again, and the filled state of the bonding material in a distal end portion of the discharge nozzle at the tip of the syringe can be adjusted to the same state as that immediately after the preceding application cycle in intermittent applications. Hence a predetermined amount of the bonding material can be reliably applied. Furthermore, since there is no need of wastefully applying the bonding material, wasteful consumption of the bonding material can be avoided. Moreover, since there is no need of providing a wasteful applying station, the size of the entire apparatus can be reduced.

In the bonding material applying apparatus according to the one embodiment of the present disclosure, preferably, the compressed air supply mechanism includes a regulator that adjusts pressure of the compressed air supplied from an air source, and a control device that controls a supply time during which the compressed air under pressure adjusted by the regulator is supplied to the syringe.

With that feature, since the compressed air supply mechanism includes a regulator that adjusts pressure of the compressed air supplied from an air source, and a control device that controls a supply time during which the compressed air under pressure adjusted by the regulator is supplied to the syringe, the compressed air can be easily controlled to be supplied for the time shorter than the discharge time necessary to discharge the bonding material.

In the bonding material applying apparatus according to the one embodiment of the present disclosure, preferably, the time which is shorter than the discharge time necessary to discharge the bonding material and during which the compressed air is supplied to such an extent that the bonding material is substantially not discharged is not shorter than about 0.15 times and not longer than about 0.75 times the discharge time.

With that feature, the time which is shorter than the discharge time necessary to discharge the bonding material and during which the compressed air is supplied to such an extent that the bonding material is substantially not discharged is not shorter than about 0.15 times and not longer than about 0.75 times the discharge time. If the time which is shorter than the discharge time necessary to discharge the bonding material and during which the compressed air is supplied to such an extent that the bonding material is substantially not discharged is shorter than about 0.15 times the discharge time, there is a risk that the bonding material could not be sufficiently filled into the discharge nozzle at the tip of the syringe in some cases. If the above-mentioned time is longer than about 0.75 times the discharge time, there is a risk that a part of the bonding material in the predetermined amount would be unintentionally discharged in some cases.

To achieve the above object, according to another preferred embodiment of the present disclosure, there is provided a bonding material applying method carried out in a bonding material applying apparatus including a syringe in which a bonding material is filled, the syringe including a discharge nozzle disposed at a tip thereof to discharge the bonding material filled in the syringe, and a compressed air supply mechanism that supplies compressed air to the syringe and discharges the bonding material from the discharge nozzle, wherein when a discharge interval from end of discharge to start of discharge of the bonding material lasts for a certain time or longer, the compressed air supply mechanism supplies the compressed air for a time, which is shorter than a discharge time necessary to discharge the bonding material, to such an extent that the bonding material is substantially not discharged.

With those features, the bonding material applying method is carried out in the bonding material applying apparatus including a syringe in which a bonding material is filled, the syringe including a discharge nozzle disposed at a tip thereof to discharge the bonding material filled in the syringe, and a compressed air supply mechanism that supplies compressed air to the syringe and discharges the bonding material from the discharge nozzle. When the discharge interval from the end of discharge to the start of discharge of the bonding material lasts for a certain time or longer, the compressed air supply mechanism supplies the compressed air for a time, which is shorter than a discharge time necessary to discharge the bonding material, to such an extent that the bonding material is substantially not discharged. Accordingly, even when air pressure in the syringe to which the compressed air is supplied from the compressed air supply mechanism has lowered due to lasting of the discharge interval for the certain time or longer, the air pressure can be raised again, and the filled state of the bonding material in a distal end portion of the discharge nozzle at the tip of the syringe can be adjusted to the same state as that immediately after the preceding application cycle in intermittent applications. Hence a predetermined amount of the bonding material can be reliably applied. Furthermore, since there is no need of wastefully applying the bonding material, wasteful consumption of the bonding material can be avoided. Moreover, since there is no need of providing a wasteful applying station, the size of the entire apparatus can be reduced.

In the bonding material applying method according to the other embodiment of the present disclosure, preferably, a supply time during which the compressed air supplied from an air source under pressure adjusted by a regulator is supplied to the syringe is controlled by the compressed air supply mechanism.

With those features, since the supply time during which the compressed air supplied from an air source under pressure adjusted by a regulator is supplied to the syringe is controlled by the compressed air supply mechanism, the compressed air can be easily controlled to be supplied for the time shorter than the discharge time necessary to discharge the bonding material.

In the bonding material applying method according to the other embodiment of the present disclosure, preferably, the time which is shorter than the discharge time necessary to discharge the bonding material and during which the compressed air is supplied to such an extent that the bonding material is substantially not discharged is not shorter than about 0.15 times and not longer than about 0.75 times the discharge time.

With that feature, the time which is shorter than the discharge time necessary to discharge the bonding material and during which the compressed air is supplied to such an extent that the bonding material is substantially not discharged is not shorter than about 0.15 times and not longer than about 0.75 times the discharge time. If the time which is shorter than the discharge time necessary to discharge the bonding material and during which the compressed air is supplied to such an extent that the bonding material is substantially not discharged is shorter than about 0.15 times the discharge time, there is a risk that the bonding material could not be sufficiently filled into the discharge nozzle at the tip of the syringe in some cases. If the above-mentioned time is longer than about 0.75 times the discharge time, there is a risk that the bonding material in the predetermined amount would be partly discharged in some cases.

Thus, according to the preferred embodiments of the present disclosure, even when the air pressure in the syringe to which the compressed air is supplied from the compressed air supply mechanism has lowered due to lasting of the discharge interval for the certain time or longer, the air pressure can be raised again, and the filled state of the bonding material in the distal end portion of the discharge nozzle at the tip of the syringe can be adjusted to the same state as that immediately after the preceding application cycle in intermittent applications. Hence the predetermined amount of the bonding material can be reliably applied. Furthermore, since there is no need of wastefully applying the bonding material, wasteful consumption of the bonding material can be avoided. Moreover, since there is no need of providing a wasteful applying station, the size of the entire apparatus can be reduced.

Other features, elements, characteristics and advantages of the present disclosure will become more apparent from the following detailed description of preferred embodiments of the present disclosure with reference to the attached drawings.

DETAILED DESCRIPTION

A preferred embodiment of the present disclosure will be described in detail below with reference to the drawings. It is to be noted that the following embodiment is described, by way of example, in connection with a bonding material applying apparatus of the type controlling a discharge amount of a bonding material with high viscosity by employing compressed air, but the type of the bonding material applying apparatus is not limited to a particular one.

Figure 1:
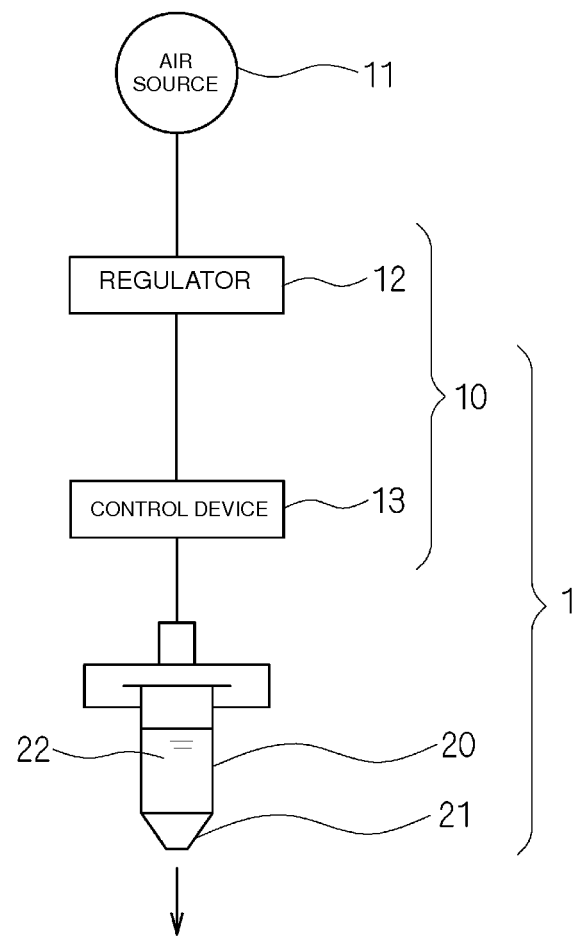
FIG. 1 is a diagram illustrating the configuration of a bonding material applying apparatus according to an embodiment of the present disclosure.

FIG. 1 is a diagram illustrating the configuration of a bonding material applying apparatus according to the embodiment of the present disclosure. A bonding material applying apparatus 1 according to this embodiment includes a syringe 20 in which a bonding material 22 is filled, and a compressed air supply mechanism 10 that supplies compressed air to the syringe 20. The compressed air supply mechanism 10 includes a regulator 12 that adjusts pressure of air supplied from an air source 11 and cleans the air through filtering as required, and a control device 13 that controls a supply time during which the compressed air under pressure adjusted by the regulator 12 is supplied to the syringe 20.

The control device 13 controls the supply time during which the compressed air is supplied to the syringe 20 including a discharge nozzle 21 provided at its tip to discharge the bonding material. The bonding material is, for example, a solder paste. When the solder paste is applied in the form of a spot, the supply time of the compressed air is controlled to about 20 to 60 ms.

Figure 2:
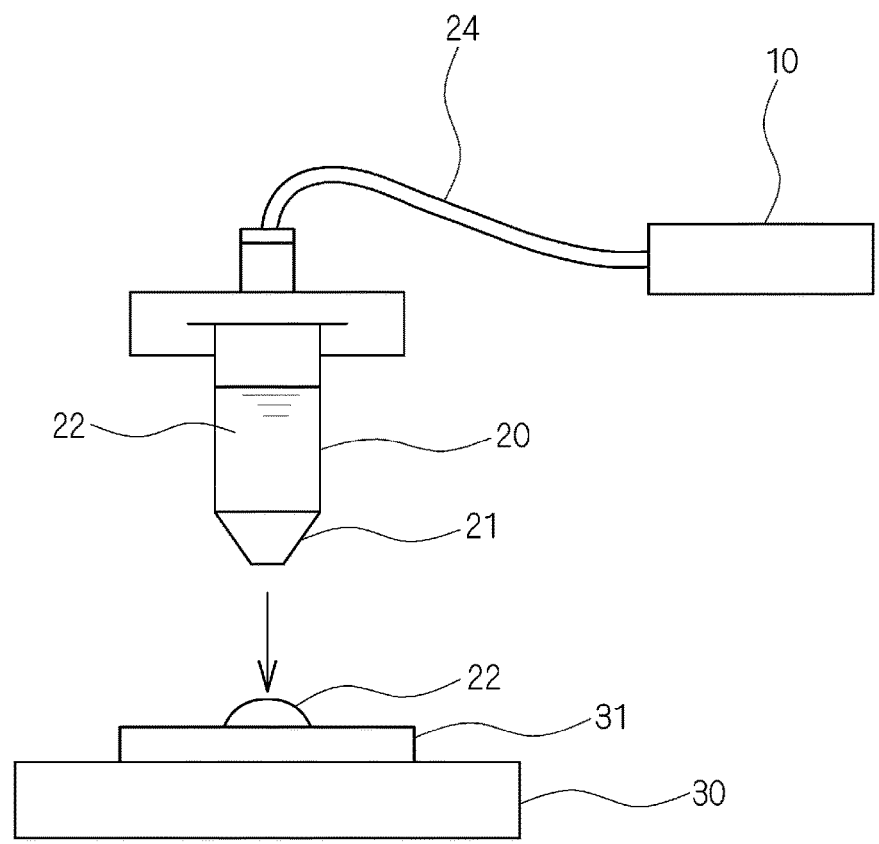
FIG. 2 is a schematic explanatory view illustrating the case where a bonding material is applied by employing the bonding material applying apparatus according to the embodiment of the present disclosure.

Thus, the compressed air under pressure adjusted by the compressed air supply mechanism 10 is supplied to the syringe 20 while the supply time is controlled. FIG. 2 is a schematic explanatory view illustrating the case where a bonding material is applied by employing the bonding material applying apparatus 1 according to the embodiment of the present disclosure.

As illustrated in FIG. 2, a bonding material 22 is filled in the syringe 20, including the discharge nozzle 21 provided at the tip of the syringe 20. The compressed air is supplied from the compressed air supply mechanism 10 to the syringe 20 through a supply tube 24, and the bonding material 22 filled in the syringe 20 is discharged from a distal end of the discharge nozzle 21. The discharged bonding material 22 is applied to an application object 31, such as a substrate, which is placed on a stage 30.

In order to discharge the bonding material 22 with the compressed air, it is required to continuously supply the compressed air for a certain time or longer, and to push out the bonding material 22 by a stronger force than the surface tension of the bonding material 22 at the distal end of the discharge nozzle 21. Speaking conversely, if the supply time of the compressed air is shorter than a discharge time t1 required to discharge the bonding material 22, the bonding material 22 is not discharged from the discharge nozzle 21.

In the embodiment of the present disclosure, a filled state of the bonding material 22 in the discharge nozzle 21 is adjusted by supplying the compressed air for a time shorter than the discharge time t1 to such an extent that the bonding material 22 is substantially not discharged. With such an adjustment, a predetermined amount of the bonding material 22 can be reliably applied even when a discharge interval from the end of discharge to the start of discharge lasts for a certain time or longer. In the following description, the time which is shorter than the discharge time t1 and during which the compressed air is supplied to such an extent that the bonding material 22 is substantially not discharged is called an "idling discharge time tb".

Figure 3A:
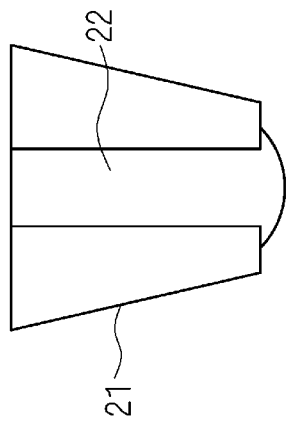
FIGS. 3A, 3B and 3C are each a schematic sectional view illustrating a state where the bonding material is filled in a discharge nozzle in the bonding material applying apparatus according to the embodiment of the present disclosure.
Figure 3B:
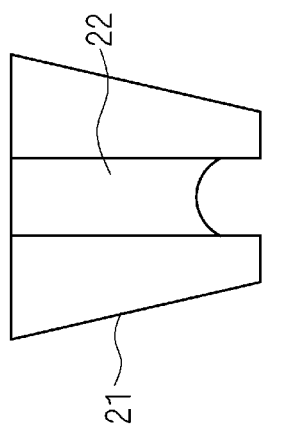
Figure 3C:
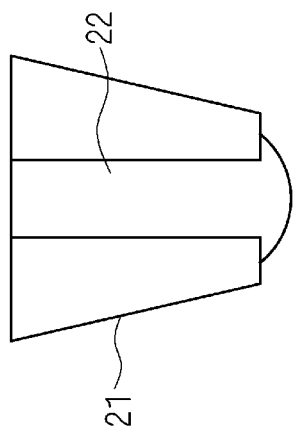

FIGS. 3A, 3B and 3C are each a schematic sectional view illustrating a state where the bonding material 22 is filled in the discharge nozzle 21 in the bonding material applying apparatus 1 according to the embodiment of the present disclosure. FIG. 3A illustrates a state immediately after applying the bonding material 22. At the distal end of the discharge nozzle 21, the bonding material 22 is held in the illustrated state by the action of surface tension. When the compressed air is supplied in the state where the bonding material 22 is held in such a condition, a predetermined amount of the bonding material 22 can be reliably applied without causing, e.g., deficiency in an amount of the bonding material applied. In the case of successively applying the bonding material 22 in an intermittent manner, the filled state of the bonding material 22 immediately before the next application is the same as that described above.

On the other hand, FIG. 3B illustrates a state where a certain time or longer has elapsed after applying the bonding material 22. Air pressure in the syringe 20 to which the compressed air is supplied from the compressed air supply mechanism 10 is kept within a predetermined range immediately after the application. However, the air pressure lowers if the discharge interval lasts for the certain time or longer. With lowering of the air pressure in the syringe 20, the bonding material 22 filled in the distal end portion of the discharge nozzle 21 comes into a state where the bonding material 22 is pulled-in to be retracted inwards from the distal end of the discharge nozzle 21. When the compressed air is supplied in such a retracted state to discharge the bonding material 22, a work load necessary to push out the bonding material 22 is increased in an amount corresponding to the retracted state. This may lead to a risk that the bonding material 22 is not discharged if the supply time of the compressed air is short.

To cope with the above-mentioned risk, in this embodiment, when a certain time or longer has elapsed after applying the bonding material 22, i.e., when the discharge interval lasts for the certain time or longer, the compressed air supply mechanism 10 supplies the compressed air for a time (idling discharge time tb) set such that the bonding material is not discharged from the discharge nozzle 21. By supplying the compressed air for the idling discharge time tb, the bonding material 22 can be restored, as illustrated in FIG. 3C, to the initially filled state similar to that illustrated in FIG. 3A. Accordingly, even when the discharge interval lasts beyond the certain time, e.g., about 30 minutes, from the preceding application, the predetermined amount of the bonding material 22 can be reliably applied by supplying the compressed air for the idling discharge time tb with no need of adjusting the filled state of the bonding material 22 in the discharge nozzle 21 without wastefully applying the bonding material 22.

The idling discharge time tb is preferably not shorter than about 0.15 times and not longer than about 0.75 times the discharge time t1 necessary to discharge the bonding material 22. The reason is as follows. If the idling discharge time tb is shorter than about 0.15 times the discharge time t1, there is a risk that the bonding material 22 could not be sufficiently filled into the discharge nozzle 21 in some cases. If the idling discharge time tb is longer than about 0.75 times the discharge time t1, there is a risk that a part of the bonding material 22 in the predetermined amount would be unintentionally discharged in some cases.

Figure 4:
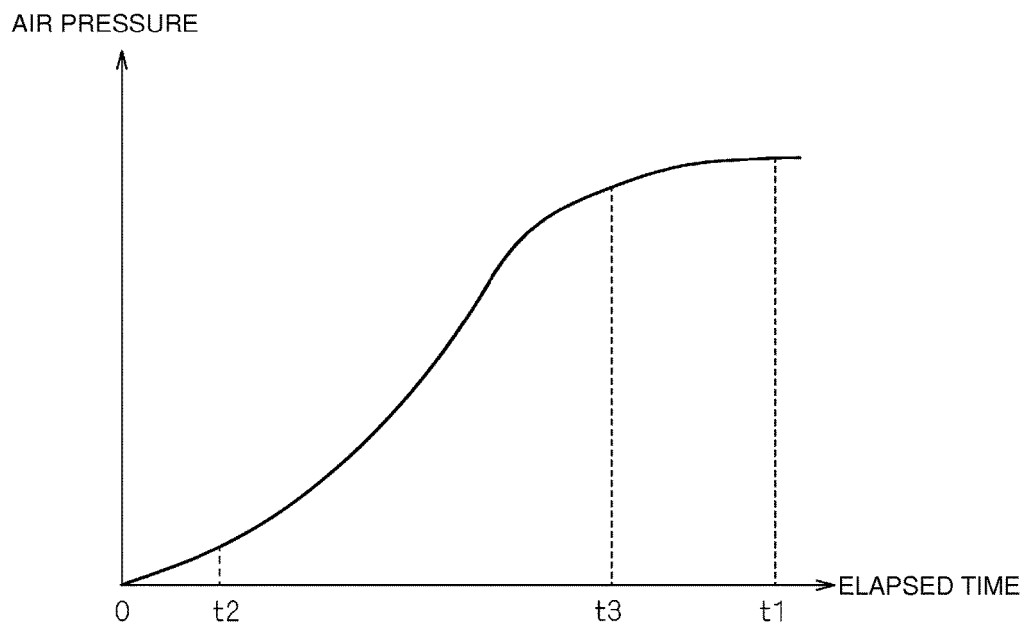
FIG. 4 is a graph depicting the relation between air pressure in a syringe and an elapsed time in the bonding material applying apparatus according to the embodiment of the present disclosure.

FIG. 4 is a graph depicting the relation between air pressure in the syringe 20 and an elapsed time in the bonding material applying apparatus 1 according to the embodiment of the present disclosure. In FIG. 4, the time at which the supply of the compressed air is started from the compressed air supply mechanism 10 is set to t=0.

When the supply of the compressed air is started from the compressed air supply mechanism 10, the air pressure in the syringe 20 is increased and the discharge of the bonding material 22 is started. In FIG. 4, the discharge of the bonding material 22 is started at t=t1. In other words, the discharge time necessary to discharge the bonding material 22 is t1.

Furthermore, FIG. 4 indicates that the preferable idling discharge time tb is between t2 (0.15 times the discharge time t1) and t3 (0.75 times the discharge time t1).

According to this embodiment, as described above, when the discharge interval lasts for the certain time or longer, the compressed air supply mechanism 10 supplies the compressed air for the idling discharge time tb, which is shorter than the discharge time necessary to discharge the bonding material 22, to such an extent that the bonding material 22 is substantially not discharged, the filled state of the bonding material 22 in the distal end portion of the discharge nozzle 21 of the syringe 20 can be adjusted to the same state as that immediately after the preceding application cycle in the intermittent application, and the predetermined amount of the bonding material 22 can be reliably applied even when the air pressure in the syringe 20 has lowered due to lasting of the discharge interval for the certain time or longer. Furthermore, since there is no need of wastefully applying the bonding material 22, wasteful consumption of the bonding material 22 can be avoided. Moreover, since there is no need of providing the wasteful applying station, the size of the entire apparatus can be reduced.

It is needless to say that the above-described embodiment can be modified within the scope not departing from the gist of the present disclosure. While the advantageous effects of the above-described embodiment are confirmed for a solder paste having a viscosity of about 50 to 55 Pa·s, which is a common example of the bonding material 22, similar advantageous effects are also expectable for other bonding materials, inks for spot printing, etc., each having a viscosity substantially at the comparable level.

Moreover, since the air pressure in the syringe 20 is adjusted, the present disclosure is not limited to the case where the discharge nozzle 21 is attached in a posture extending downward as in the above-described embodiment, the discharge nozzle 21 may be attached in a posture extending horizontally, for example.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A bonding material applying method carried out in a bonding material applying apparatus including
  a syringe in which a bonding material is filled, the syringe including a discharge nozzle disposed at a tip thereof to discharge the bonding material filled in the syringe; and
  a compressed air supply mechanism that supplies compressed air to the syringe and discharges the bonding material from the discharge nozzle, the bonding material applying method comprising
  supplying compressed air by the compressed air supply mechanism for a time when a discharge interval from end of discharge to start of discharge of the bonding material lasts for a certain time or longer, the time of supplying compressed air by the compressed air supply being shorter than a discharge time necessary to discharge the bonding material, to such an extent that the bonding material is substantially not discharged.

2. The bonding material applying method according to claim 1, wherein a supply time during which the compressed air supplied from an air source under pressure adjusted by a regulator is supplied to the syringe is controlled by the compressed air supply mechanism.

3. The bonding material applying method according to claim 1, wherein the time which is shorter than the discharge time necessary to discharge the bonding material and during which the compressed air is supplied to such an extent that the bonding material is substantially not discharged is not shorter than about 0.15 times and not longer than about 0.75 times the discharge time.

4. The bonding material applying method according to claim 1, wherein when supplying the compressed air by the compressed air supply mechanism for the time when the discharge interval from the end of the discharge to the start of the discharge of the bonding material lasts for the certain time or longer, such that the bonding material is held in a retracted state in the syringe, the time of supplying the compressed air by the compressed air supply being shorter than the discharge time necessary to discharge the bonding material, to the extent that the bonding material is substantially not discharged, such that the bonding material is held in a filled state in the syringe.

5. The bonding material applying method according to claim 1, wherein the bonding material has a viscosity of about 50-55 Pas.

* * * * *